(12) United States Patent
Sato et al.

(10) Patent No.: US 9,709,641 B2
(45) Date of Patent: Jul. 18, 2017

(54) MAGNETIC RESONANCE IMAGING APPARATUS, IMAGE PROCESSING APPARATUS, AND SUSCEPTIBILITY MAP CALCULATION METHOD

(71) Applicant: HITACHI, LTD., Tokyo (JP)

(72) Inventors: Ryota Sato, Tokyo (JP); Toru Shirai, Tokyo (JP); Yo Taniguchi, Tokyo (JP); Hisaaki Ochi, Tokyo (JP); Yoshitaka Bito, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 421 days.

(21) Appl. No.: 14/466,235

(22) Filed: Aug. 22, 2014

(65) Prior Publication Data
US 2015/0084628 A1 Mar. 26, 2015

(30) Foreign Application Priority Data

Sep. 26, 2013 (JP) ................................. 2013-199651

(51) Int. Cl.
*G01R 33/24* (2006.01)
*G01R 33/565* (2006.01)

(52) U.S. Cl.
CPC ...... *G01R 33/243* (2013.01); *G01R 33/56536* (2013.01)

(58) Field of Classification Search
CPC ......................... G01R 33/243; G01R 33/56536
See application file for complete search history.

(56) References Cited

U.S. PATENT DOCUMENTS

| 6,501,272 B1* | 12/2002 | Haacke | G01R 33/54 324/306 |
| 6,658,280 B1* | 12/2003 | Haacke | A61B 5/02007 324/306 |
| 2003/0212322 A1* | 11/2003 | Haacke | A61B 5/02007 600/410 |
| 2011/0275926 A1* | 11/2011 | Du | G01R 33/5635 600/410 |
| 2014/0219533 A1* | 8/2014 | Sato | A61B 5/055 382/131 |
| 2015/0338492 A1* | 11/2015 | Sato | G01R 33/5608 600/410 |

OTHER PUBLICATIONS

Ludovic de Rochefort et al.,"Quantitative Susceptibility Map Reconstruction from MR Phase Data Using Bayesian Regularization: Validation and Application to Brain Imaging", Journal pf Magnetic Resonance in Medicine 63, 2010, p. 194-206.

* cited by examiner

*Primary Examiner* — G. M. Hyder
(74) *Attorney, Agent, or Firm* — Brundidge & Stanger, P.C.

(57) ABSTRACT

Disclosed is a magnetic resonance imaging apparatus that calculates a susceptibility map using a weighting image that reflects a phase variation with high accuracy. The weighting image is calculated from a phase image obtained from a complex image obtained by MRI. First, a region used in calculation of the phase variation is set as a calculation region, and then, a standard deviation or a variance of pixel values of the phase image in the calculation region is set as the phase variation. Further, the phase variation is converted into a weight that monotonically decreases in a broad sense as the phase variation increases to obtain the weighting image.

15 Claims, 12 Drawing Sheets

100

101

102

FIG. 9
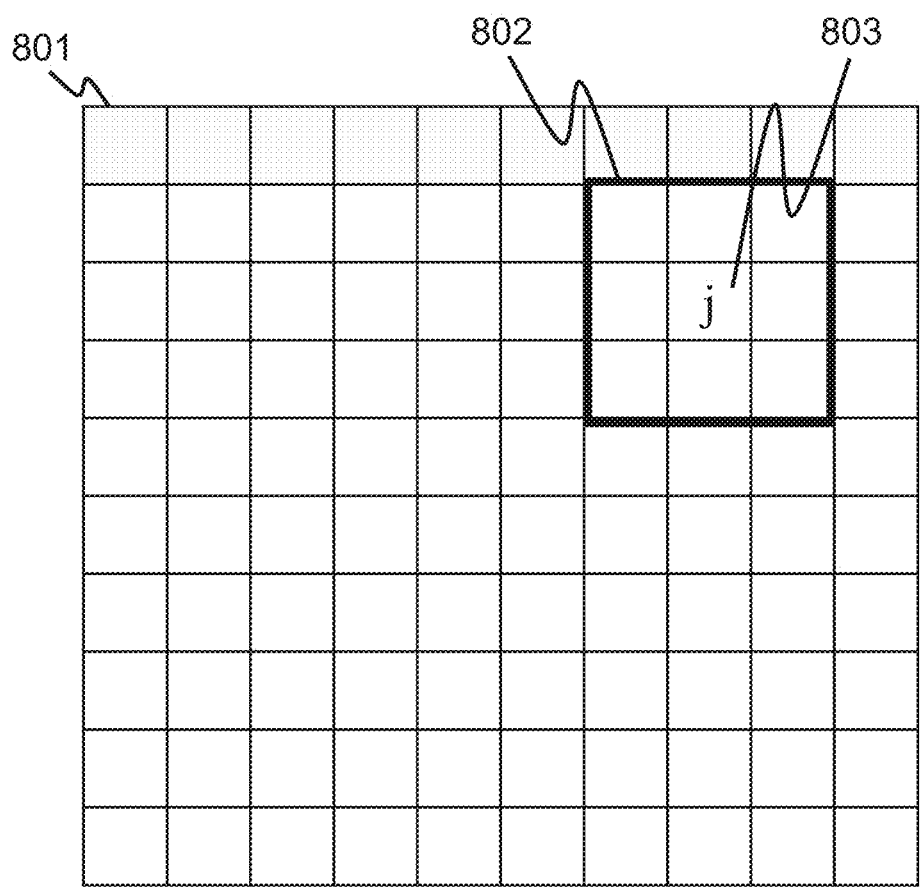
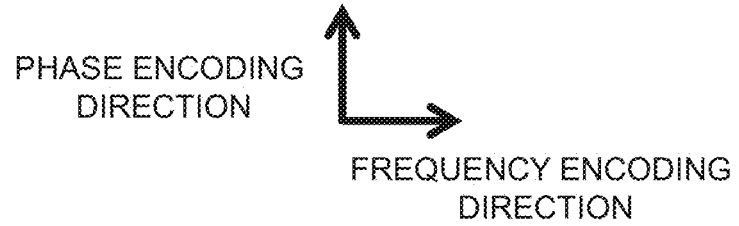

FIG. 11A ABSOLUTE IMAGE
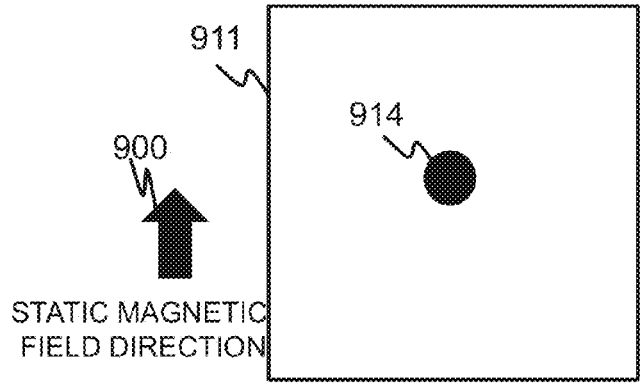
FIG. 11B WEIGHTING IMAGE (CALCULATION FROM ABSOLUTE IMAGE)
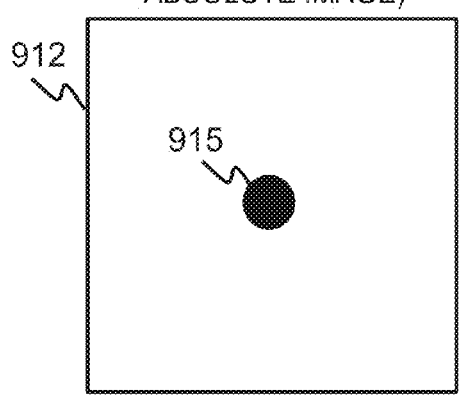
FIG. 11C SUSCEPTIBILITY MAP
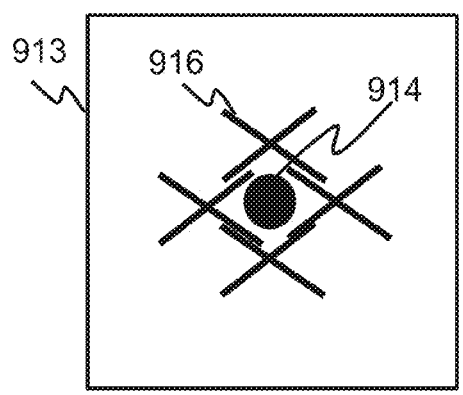
FIG. 11D PHASE IMAGE
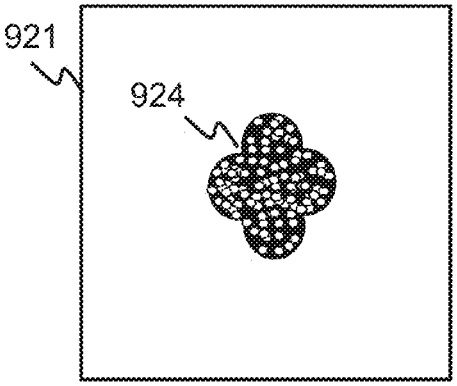
FIG. 11E WEIGHTING IMAGE (CALCULATION FROM PHASE IMAGE)
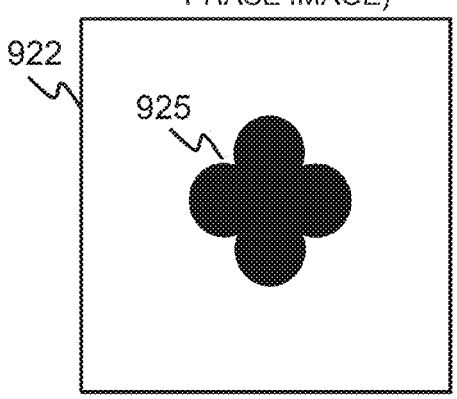
FIG. 11F SUSCEPTIBILITY MAP
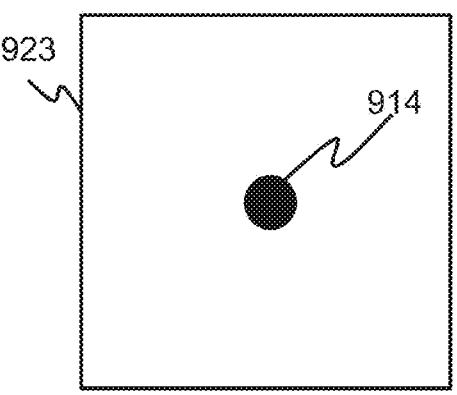

FIG. 12A ABSOLUTE IMAGE
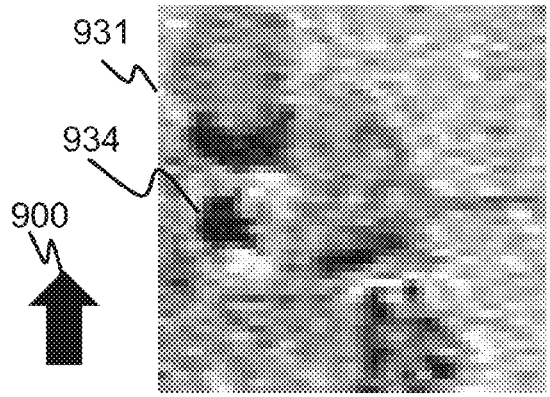
931
934
900
STATIC MAGNETIC FIELD DIRECTION
FIG. 12B PHASE IMAGE
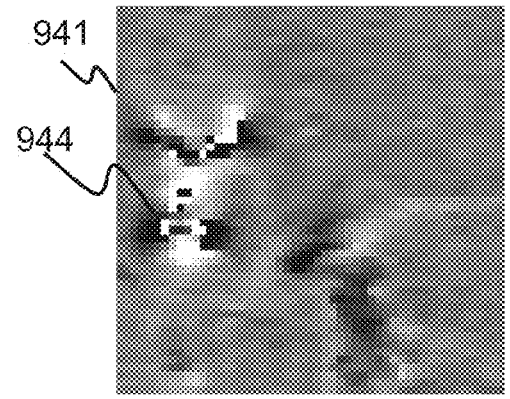
941
944
FIG. 12C WEIGHTING IMAGE (CALCULATION FROM PHASE IMAGE)
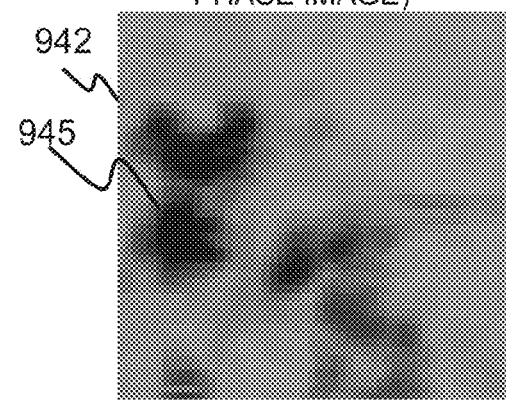
942
945
FIG. 12D SUSCEPTIBILITY MAP
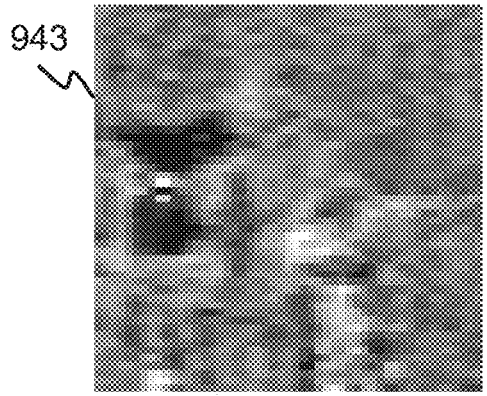
943

MAGNETIC RESONANCE IMAGING APPARATUS, IMAGE PROCESSING APPARATUS, AND SUSCEPTIBILITY MAP CALCULATION METHOD

INCORPORATION BY REFERENCE

The present application claims priority from Japanese patent application JP-2013-199651 filed on Sep. 26, 2013, the content of which is hereby incorporated by reference into this application.

BACKGROUND OF THE INVENTION

1. Field of the Invention

The present invention relates to a magnetic resonance imaging (MRI) technique, and more particularly, to an image processing technique of a reconstructed image.

2. Description of Prior Art

A magnetic resonance imaging apparatus (hereinafter, referred to as an MRI apparatus) is a diagnostic imaging device for medical use, which applies a radio frequency magnetic field and a gradient magnetic field to a subject placed in a static magnetic field, measures a signal generated from the subject by magnetic resonance, and forms an image from the signal.

In the MRI apparatus, in general, a slice gradient magnetic field for specifying an imaging section is applied, and simultaneously, an excitation pulse for exciting magnetization in the imaging section (radio frequency magnetic field pulse) is applied. Thus, a magnetic resonance signal (echo) generated in convergence of the excited magnetization is obtained. In this process, in order to impart three-dimensional positional information to the magnetization, the slice gradient magnetic field, a phase encoding gradient magnetic field and a read-out gradient magnetic field that are perpendicular to each other on the imaging section are applied during the period from the excitation to the obtainment of the echo. The measured echoes are arranged in a k-space having a kx axis, a ky axis, and a kz axis, and are subjected to inverse Fourier transform to perform image reconstruction.

Each pixel value of the reconstructed image forms a complex number including an absolute value and a declination (phase). A gray-scale image in which the pixel values are the absolute values (absolute image) is an image that reflects the density of protons (hydrogen nuclei) or relaxation times (T1 and T2), which is advantageous for depiction of a tissue structure. On the other hand, a gray-scale image in which the pixel values are the phase values (phase image) is an image that reflects a magnetic field change due to unevenness of the static magnetic field, a susceptibility difference between biological tissues, or the like.

In recent years, a quantitative susceptibility mapping (QSM) technique that uses the fact that a phase image reflects a susceptibility difference between tissues and estimates susceptibility distribution in a living body from the phase image has been proposed. An image obtained by approximately estimating the susceptibility of each pixel from the phase image based on the relationship between the phase and the susceptibility and using the estimated susceptibility as the pixel value is referred to as a susceptibility map. It is known that the susceptibility of the living body is changed according to the amount of iron or the amount of oxygen in a vein. The change of the susceptibility provides information useful for diagnosis of neurodegenerative diseases or apoplexy.

In the QSM, the susceptibility distribution is estimated from phase distribution. Here, since the phase distribution is calculated by spatially convolution-integrating the susceptibility distribution, the phase is changed in the vicinity of a region where the change of the susceptibility occurs according to the direction or intensity of the static magnetic field. Accordingly, when the susceptibility distribution is calculated from the phase distribution, the inverse problem of the convolution integration arises, which makes it difficult to simply obtain a solution.

In general, the susceptibility distribution is calculated from the phase distribution using the least squares method. Here, an error function is introduced, and a value that minimizes the error function is used as a solution.

The phase varies in a region where the signal-to-noise (SN) ratio of the image is low. Further, in a region where a tissue having a size smaller than 1 voxel exists, an error occurs in the phase value due to a partial volume effect. Hereinafter, the variation of the phase or the error of the phase value is referred to as phase variation. The phase variation decreases the calculation accuracy of the susceptibility map. Further, a streaking artifact occurs in the vicinity of a region where the phase variation is large.

In order to enhance the estimation accuracy of the susceptibility map to be calculated to reduce the artifact, weighting is performed for the error function according to the degree of the variation at each region in the phase image. The weighting is performed so that a weight of the region where the phase variation is large becomes small. An image in which the pixel value of each pixel is a weighting factor for the weighting of the error function used for the susceptibility calculation is referred to as a weighting image.

In the prior art, an absolute image is used as the weighting image (see Rochefort L, et al., "Quantitative Susceptibility Map Reconstruction from MR Phase Data Using Baysian Regularization: Validation and Application to Brain Imaging", Magnetic Resonance in Medicine, 2010, Vol. 63, No. 1, pp. 194 to 206. (Non-patent document 1)). In a region where the pixel value of the absolute image is small, there is a tendency that the SN ratio of the image is small and the phase variation is large. Thus, by using a weight proportional to the pixel value of the absolute image, it is possible to decrease the weight of the region where the phase variation is large.

SUMMARY OF THE INVENTION

However, the pixel value of the absolute image does not necessarily correspond to the degree of the phase variation. For example, the pixel value of the absolute image is changed in every tissue due to the influence of the difference of the T1 value and the T2 value or flow. Thus, even though the degree of the phase variation is the same between the tissues, the pixel value of the absolute image may be different between the tissues. In this case, in the weighting image that is proportional to the pixel value of the absolute image, even in nearly the same phase variation, the size of the weight is changed in every tissue. As a result, the calculated susceptibility value is changed in every tissue, and thus, the estimation accuracy of the susceptibility map decreases.

Further, in a region where the susceptibility is greatly changed, such as a large vein, the SN ratio decreases, and the phase varies. Here, the region where the phase variation is large expands wider than the region where the SN ratio decreases due to the influence of the static magnetic field. Thus, if the weight based on the absolute image is used, it is difficult to reduce the weight of the expanded region where the phase variation is large, which causes the occurrence of the artifact.

In order to solve the above problems, an object of the invention is to provide a technique capable of enhancing estimation accuracy of a susceptibility map in the quantitative susceptibility mapping to reduce an artifact.

According to an aspect of the invention, there is provided a magnetic resonance imaging apparatus that calculates a susceptibility map using a weighting image that reflects a phase variation with high accuracy. The weighting image is calculated from a phase image obtained from a complex image obtained by MRI. First, a region used in calculation of the phase variation is set as a calculation region, and then, a standard deviation or a variance of pixel values of the phase image in the calculation region is set as the phase variation. Further, the phase variation is converted into a weight that monotonically decreases in a broad sense as the phase variation increases to obtain the weighting image.

According to the invention, it is possible to enhance estimation accuracy of a susceptibility map in the quantitative susceptibility mapping to reduce an artifact.

BRIEF DESCRIPTION OF THE DRAWINGS

FIG. 9 is a diagram illustrating a calculation region to be set according to an embodiment of the invention.

FIG. 11A is a diagram illustrating an absolute image.

FIGS. 11B and 11C are diagrams illustrating a weighting image and a susceptibility map calculated according to a prior art technique.

FIG. 11D is a diagram illustrating a phase image.

FIGS. 11E and 11F are diagrams illustrating a weighting image and a susceptibility map calculated according to an embodiment of the invention.

FIG. 12A is a diagram illustrating an absolute image.

FIG. 12B is a diagram illustrating a phase image.

FIGS. 12C and 12D are diagrams illustrating a weighting image and a susceptibility map calculated according to an embodiment of the invention.

DESCRIPTION OF EMBODIMENTS

Hereinafter, a first embodiment of the invention will be described with reference to the accompanying drawings. In all the drawings for description of the embodiments of the invention, components having the same functions are indicated by the same reference signs, unless specifically mentioned, and a repetitive description thereof is omitted. The invention is not limited by the following description.

<Appearance of MRI Apparatus>

Figure 1A:
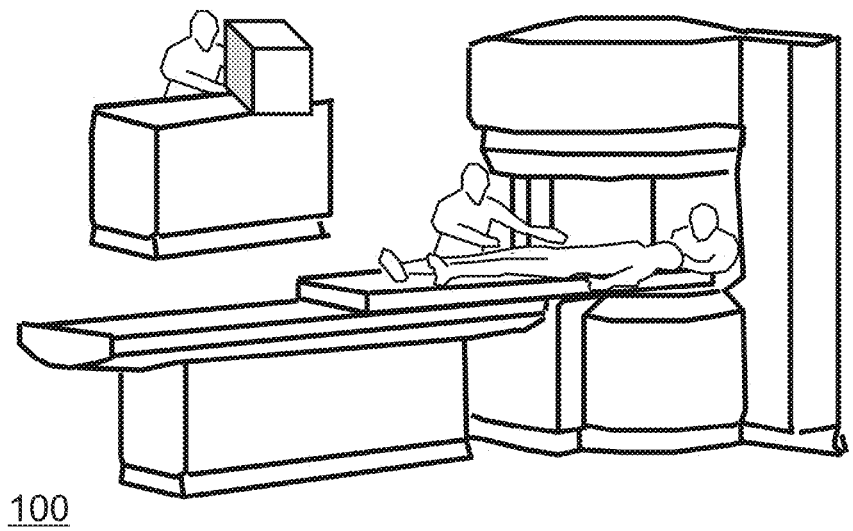
FIG. 1A is an external view of a magnetic resonance imaging apparatus of a vertical magnetic field type according to an embodiment of the invention.
Figure 1B:
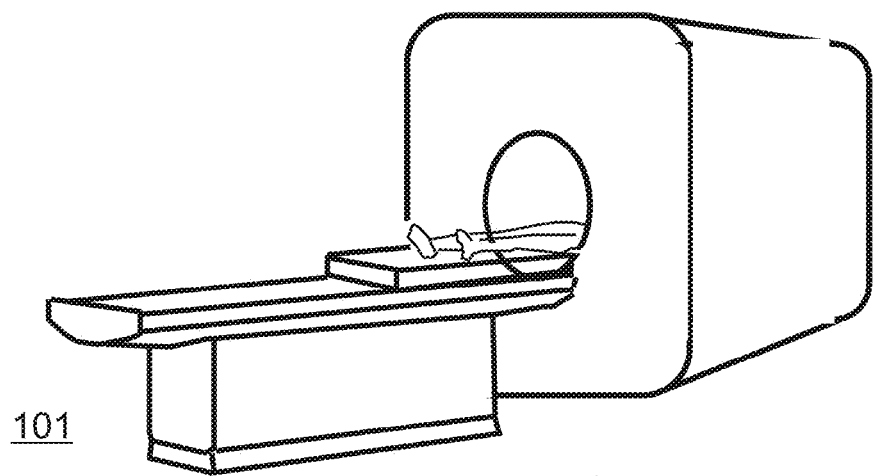
FIG. 1B is an external view of a magnetic resonance imaging apparatus of a horizontal magnetic field type according to an embodiment of the invention.
Figure 1C:
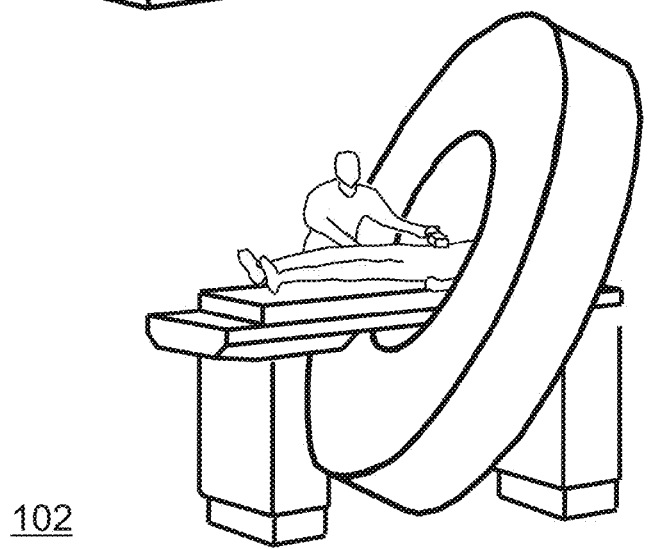
FIG. 1C is an external view of a magnetic resonance imaging apparatus in which spaciousness is improved.

First, an MRI apparatus according to the present embodiment will be described. FIGS. 1A to 1C are external views of MRI apparatuses according to the present embodiment. FIG. 1A shows an MRI apparatus 100 of a vertical magnetic field type (vertical magnetic field MRI apparatus) that employs a hamburger type (open type) magnet having separated upper and lower magnets, which are used for increasing spaciousness. FIG. 1B shows an MRI apparatus 101 of a horizontal magnetic field type (horizontal magnetic field MRI apparatus) that employs a tunnel-shaped magnet that generates a static magnetic field with a solenoid coil. Further, FIG. 1C shows an MRI apparatus 102 that employs a tunnel-shaped magnet similar to that shown in FIG. 1B, in which the depth of the magnet is shortened and the magnet is inclined to increase spaciousness. The forms of these MRI apparatuses are mere examples of those of the vertical magnetic field type and the horizontal magnetic field type, and the invention is not limited thereto.

Hereinafter, the present embodiment will be described using the horizontal magnetic field MRI apparatus 101 shown in FIG. 1B as an example. Further, in the present embodiment, there is used a coordinate system in which a static magnetic direction of the MRI apparatus 101 is defined as a z direction, a direction that is parallel to a bed surface on which a subject of a measurement target is placed, among two directions perpendicular to the z direction, is defined as an x direction, and the other direction among the two directions is defined as a y direction. Further, hereinafter, the static magnetic field may also be simply referred to as a magnetic field.

<Schematic Configuration of MRI Apparatus>

Figure 2:
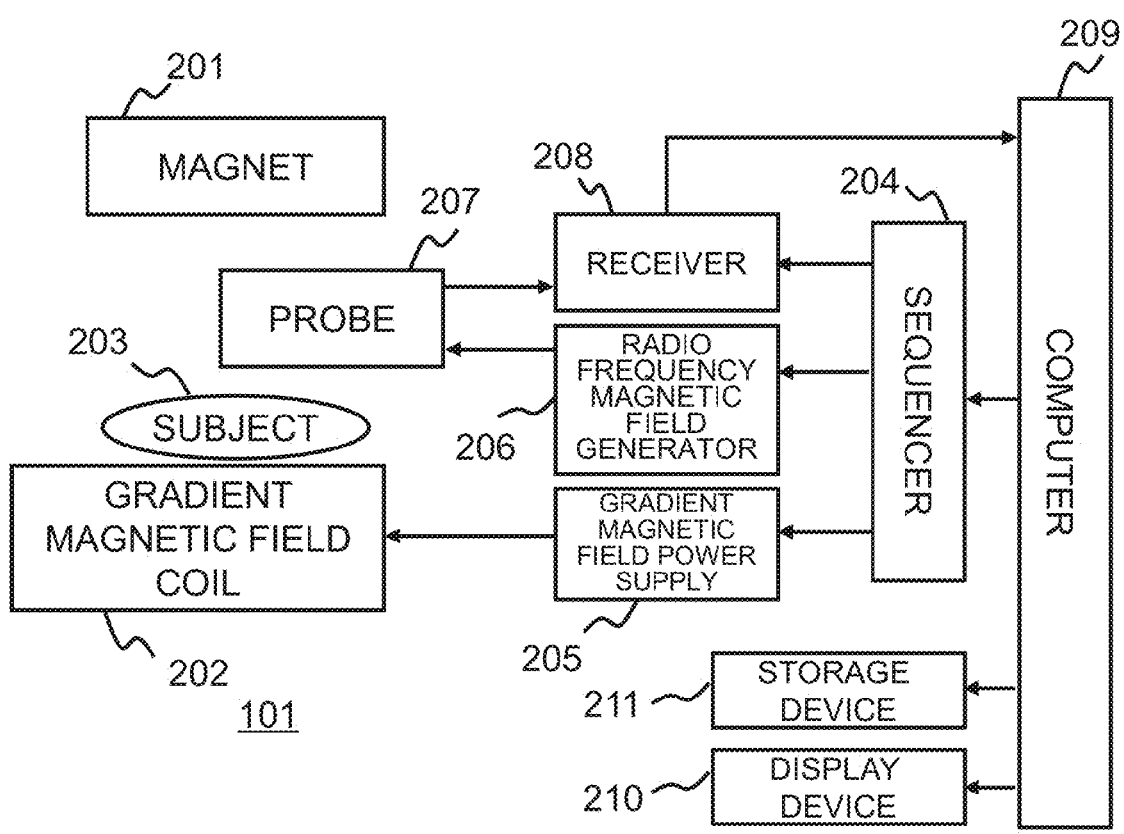
FIG. 2 is a block diagram illustrating a schematic configuration of an MRI apparatus according to an embodiment of the invention.

FIG. 2 is a block diagram showing a schematic configuration of the MRI apparatus 101 according to the present embodiment. The MRI apparatus 101 is provided with a magnet 201 that generates a static magnetic field in a direction parallel to a subject, a gradient magnetic field coil 202 that generates a gradient magnetic field, a sequencer 204, a gradient magnetic field power supply 205, a radio frequency magnetic field generator 206, a probe 207 that irradiates a radio frequency magnetic field and detects a magnetic resonance signal (echo), a receiver 208, a computer 209, a display device 210, and a storage device 211.

A subject 203 (for example, living body) is placed on a bed (table) or the like, and is disposed in a static magnetic field space generated by the magnet 201. In the present embodiment, it is assumed that the imaging target is a brain. Thus, a head portion of the subject is disposed in the static magnetic field space. The imaging target is not limited to the brain, and may be an arbitrary portion such as a liver or heart.

The sequencer 204 sends a command to the gradient magnetic field power supply 205 and the radio frequency magnetic field generator 206, so that the gradient magnetic field power supply 205 and the radio frequency magnetic field generator 206 generate a gradient magnetic field and a radio frequency magnetic field, respectively. The generated radio frequency magnetic field is applied to the subject 203 through the probe 207. An echo generated from the subject 203 is received by the probe 207, and is detected by the receiver 208. A magnetic resonance frequency that serves as a reference of the detection (detection reference frequency $f_0$) is set by the sequencer 204.

The detected signal is sent to the computer 209, and signal processing such as image reconstruction is performed by the computer. The result is displayed in the display device 210. The detected signal, a measurement condition, image information after the signal processing, or the like may be stored in the storage device 211, as necessary.

The sequencer 204 controls the respective parts so that the parts operate at timings and intensities programmed in advance. Among programs, a program for describing timings and intensities of the radio frequency magnetic field, the gradient magnetic field and the signal reception is particularly called a pulse sequence.

The pulse sequence may employ known various pulse sequences suitable for various purposes, and may employ an arbitrary pulse sequence. In the present embodiment, an example in which a pulse sequence of a GrE (gradient echo) type that can obtain a signal according to unevenness of spatial distribution of the magnetic field intensity is used will be described. As the GrE type sequence, for example, an RF spoiled type gradient echo (RF spoiled GrE) sequence may be used.

The computer 209 of the present embodiment instructs the sequencer 204 to measure the echo according to a set measurement parameter and the pulse sequence, to thereby measure the echo. Further, the computer 209 arranges the obtained echo in the k-space, performs calculation for the echo arranged in the k-space to generate an image of a desired contrast. The generated image is displayed in the display device 210.

Figure 3:
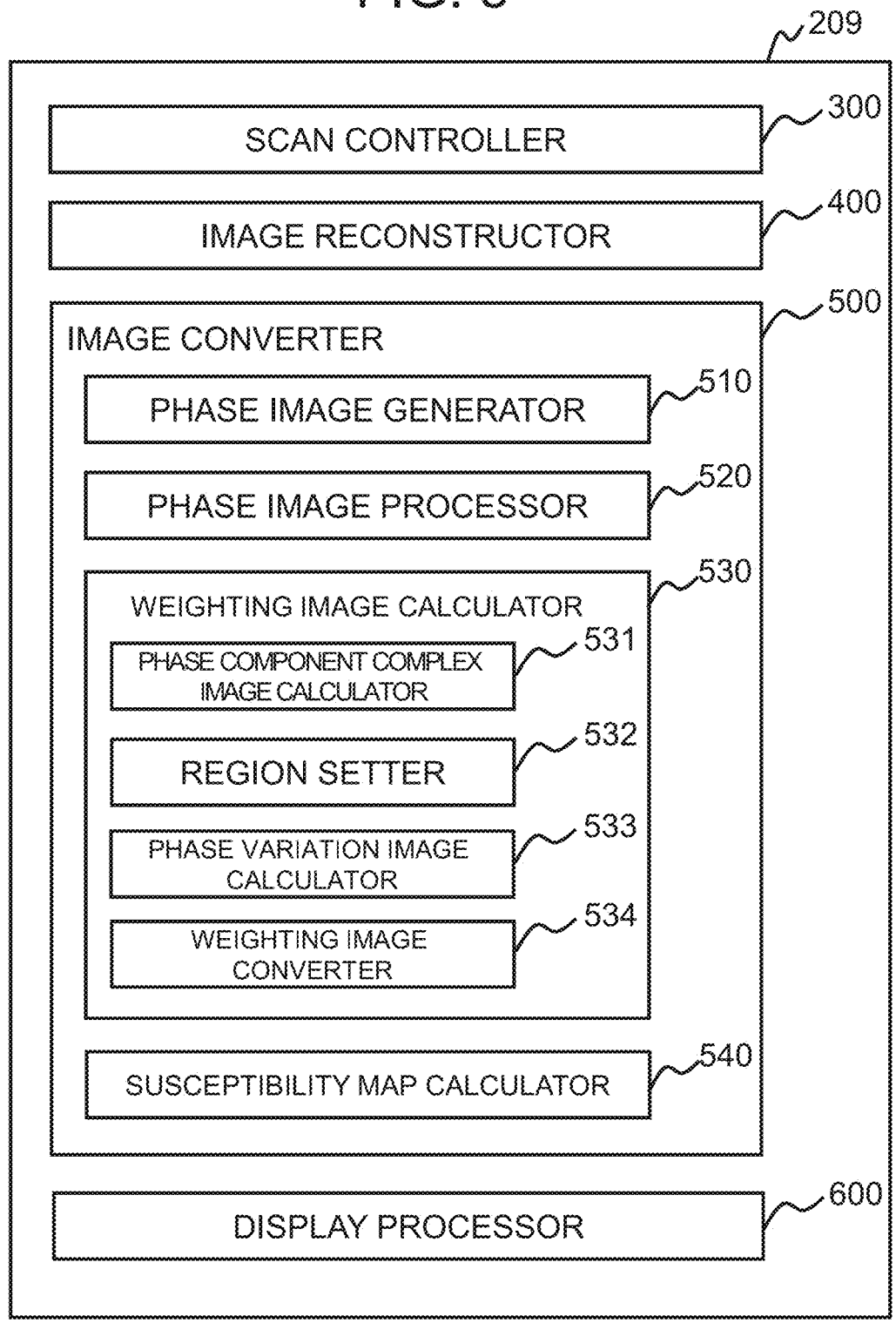
FIG. 3 is a functional block diagram illustrating a computer according to an embodiment of the invention.

In the present embodiment, the computer 209 further generates a susceptibility map in which the susceptibility distribution in the living body is estimated from the generated image. In order to realize this image generation, as shown in FIG. 3, the computer 209 according to the present embodiment is provided with a scan controller (scan means) 300 that controls the respective parts of the MRI apparatus 100 according to the pulse sequence and measures the magnetic resonance signal (echo signal) generated from the subject 203 as a complex signal, an image reconstructor (image reconstruction means) 400 that reconstructs a complex image in which each pixel value is a complex number from the complex signal using a known technique, an image converter (image converting means) 500 that converts the complex image into a susceptibility map, and a display processor (display process means) 600 that allows the display device 210 to display the generated image. In the present embodiment, for example, the generated susceptibility map is displayed in the display device 210.

The respective functions of the computer 209 are realized as the CPU of the computer 209 loads a program stored in the storage device 211 onto a memory and executes the program. All or part of the functions can be realized by the hardware such as ASIC (Application Specific Integrated Circuit), FPGA (field-programmable gate array), or the like. Various data used in the process realized by each function and generated during processes are stored in the storage device 211.

<Flow of Imaging Process>

Figure 4:
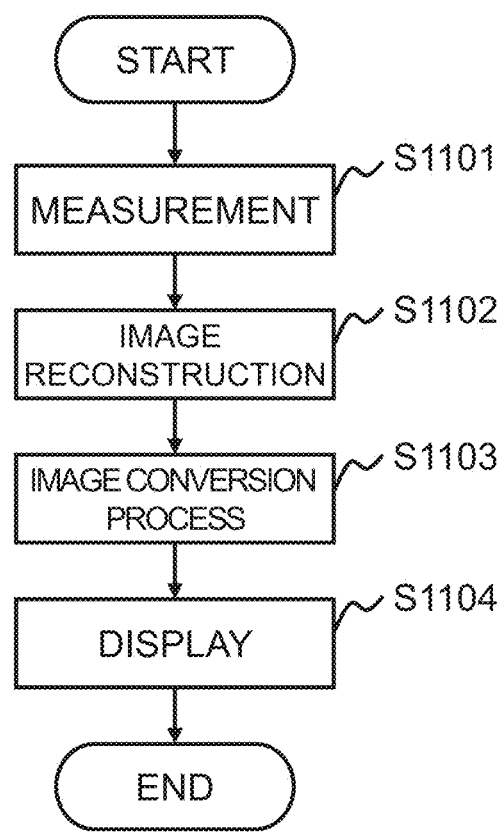
FIG. 4 is a flowchart illustrating an imaging process according to an embodiment of the invention.

Hereinafter, details of the imaging process performed by the scan controller 300, the image reconstructor 400, the image converter 500, and the display processor 600 of the computer 209 according to the present embodiment will be described according to the flow of processes. FIG. 4 shows the process flow of the imaging process according to the present embodiment.

When various measurement parameters are set and an instruction for the start of imaging is received, the scan controller 300 performs measurement (step S1101). Here, the scan controller 300 gives an instruction to the sequencer 204 according to a predetermined pulse sequence to obtain an echo signal and to arrange the obtained echo signal in the k-space. As described above, the sequencer 204 sends a command to the gradient magnetic field power supply 205 and the radio frequency magnetic field generator 206 according to the instruction to generate a gradient magnetic field and a radio frequency magnetic field, respectively. The scan controller 300 receives the echo received by the probe 207 and detected by the receiver 208 as a complex signal. The scan controller 300 repeats the measurement until the echoes necessary for obtaining one sheet of image are obtained.

When the scan controller 300 finishes the measurement, the image reconstructor 400 performs an image reconstruction process of reconstructing an image from the echoes arranged in the k-space (step S1102). Here, a process such as three-dimensional inverse Fourier transform is performed for the echoes (data) arranged in the k-space, to reconstruct a complex image in which each pixel value is represented as a complex number.

The image converter 500 performs various image conversion processes, to be described later, for the obtained complex image (step S1103). In the present embodiment, the image converter 500 converts the complex image obtained in the image reconstructor 400 into the susceptibility map. Details of the image conversion process according to the present embodiment will be described later.

Further, the display processor 600 displays the obtained susceptibility map in the display device 210 as a gray-scale image (step S1104). Here, plural pieces of image information may be combined for display using a technique such as maximum intensity projection processing.

<Example of Pulse Sequence>

Hereafter, an example of the pulse sequence that the scan controller 300 follows in the measurement will be described. In the present embodiment, as described above, the GrE type pulse sequence is used, for example. The GrE type pulse sequence will be described using the RF spoiled GrE sequence as an example.

Figure 5:
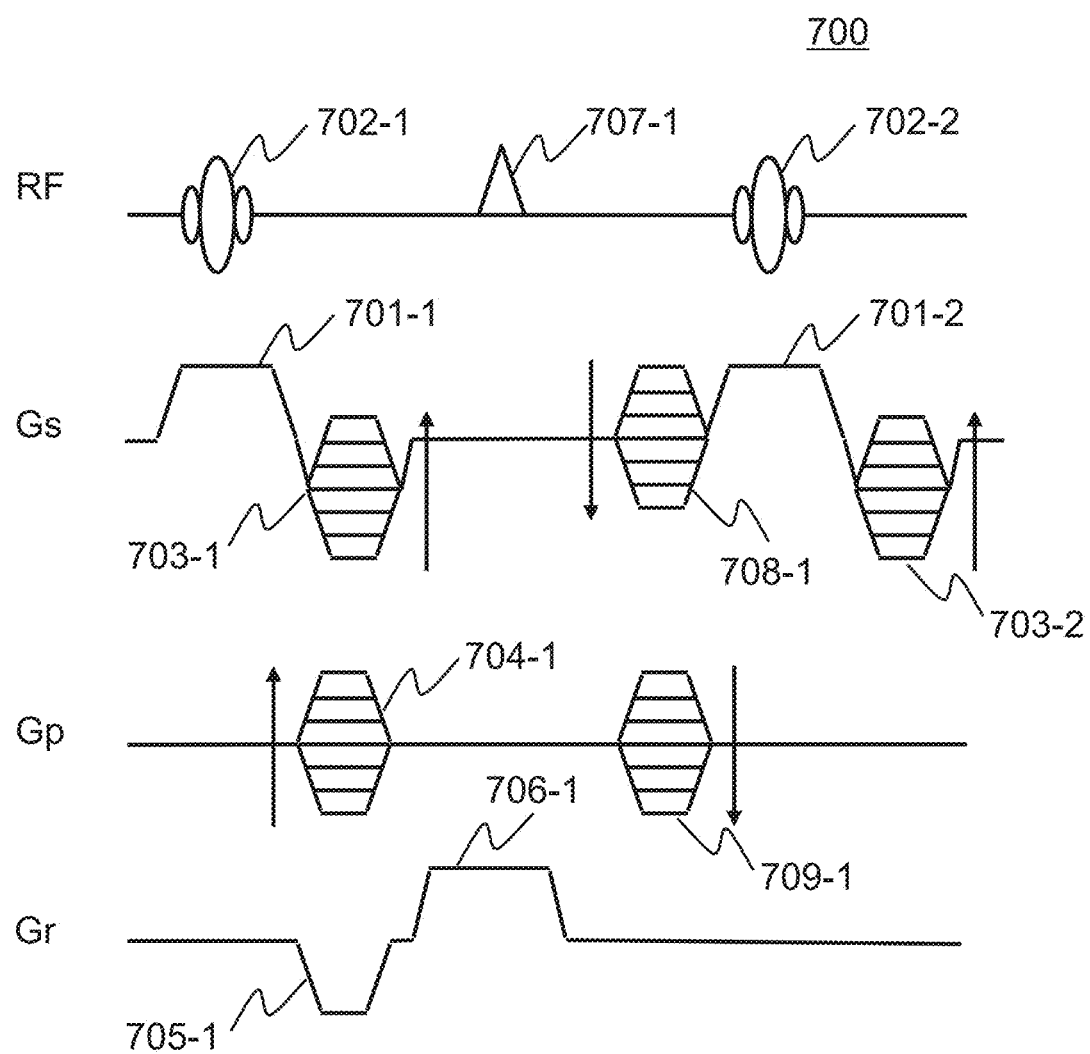
FIG. 5 is a diagram illustrating a pulse sequence used in measurement according to an embodiment of the invention.

FIG. 5 is a pulse sequence diagram illustrating an RF spoiled GrE sequence 700. In FIG. 5, RF/Echo represents timings of irradiation of a radio frequency magnetic field pulse and measurement of an echo, and Gs, Gp and Gr represent application timings of a slice gradient magnetic field pulse, a phase encoding gradient magnetic field pulse, and a read-out gradient magnetic field pulse, respectively.

In the RF spoiled GrE sequence 700, a slice gradient magnetic field pulse 701 is applied and a radio frequency (RF) pulse 702 is irradiated to excite magnetization of a predetermined slice inside the subject 203. Then, a slice encoding gradient magnetic field pulse 703 and a phase encoding gradient magnetic field pulse 704 are applied to add position information of a slice direction and a phase encoding direction to the phase of the magnetization.

Further, a read-out gradient magnetic field pulse 705 for dephasing, that is, for dispersing phases of magnetization inside the pixels is applied. Then, a read-out gradient magnetic field pulse 706 for adding position information on a read-out direction is applied, and at this time, one magnetic resonance signal (echo) 707 is measured. Finally, a slice encoding gradient magnetic field pulse 708 and a phase encoding gradient magnetic field pulse 709 for rephasing, that is, for converging the phases of magnetization dephased by the slice encoding gradient magnetic field pulse 703 and the phase encoding gradient magnetic field pulse 704 are applied.

The scan controller 300 repeatedly executes the above-described procedure at a repetition time TR while changing the intensities of the slice encoding gradient magnetic field pulses 703 and 708 (the number of slice encodings is ks) and the phase encoding gradient magnetic field pulses 704 and 709 (the number of phase encodings is kp) and the phase of an RF pulse 702, to measure the echoes necessary for obtaining one sheet of image. Here, the phase of the RF pulse 702 is increased by a predetermined amount, for example, by 117 degrees. Further, in FIG. 5, a numeral after a hyphen represents the number of repetitions.

Each of the measured echoes is arranged in the three-dimensional k-space having the kr axis, the kp axis, and the ks axis as coordinate axes. Here, one echo occupies one line parallel to the kr axis in the k-space. An absolute image reconstructed from the echoes obtained by the RF spoiled GrE sequence 700 becomes a T1 (longitudinal relaxation time)-weighted image if TE (time from the irradiation of the RF pulse 702 to the measurement of the echo 707) is set to be short, and becomes a T2*—weighted image that reflects the phase dispersion in the pixels if TE is set to be long.

Hereinbefore, the RF spoiled GrE sequence 700 that is a Cartesian imaging technique for obtaining data parallel to the coordinate axes of the k-space as the pulse sequence that the scan controller 300 follows is described as an example, but the pulse sequence is not limited thereto. The scan controller 300 may use any sequence capable of obtaining a phase image with a desired accuracy, and may use an arbitrary sequence to obtain data in an arbitrary k-space region.

For example, a sequence for obtaining plural echoes during one TR may be used. Here, the obtained plural echoes may be arranged in different k-spaces. Further, a sequence of non-Cartesian imaging such as radial scanning for obtaining data in a radially form in the k-space may be used. In addition, the imaging process may be performed plural times, so as to obtain data in different k-space regions in the respective imaging processes, and then, the data in different k-space regions may be combined. In other words, one sheet of complex images or phase images may be reconstructed from different complex images or phase images obtained by the plural echoes.

<Image Conversion Process>

Next, the image conversion process in the image converter 500 will be described. In the present embodiment, the phase image is obtained from the complex image, and the susceptibility map is calculated from the phase image.

As described above, in the quantitative susceptibility mapping, the susceptibility map (susceptibility distribution) is estimated from the phase distribution (phase image). Here, the relational equation of a phase distribution $\phi$ and a susceptibility distribution $\chi$ represented as the following Equation (1) is used.

$$\phi(\vec{r}) = -\frac{\gamma B_0 \tau_{TE}}{4\pi} \int \chi(\vec{r}') \frac{3\cos^2\alpha - 1}{|\vec{r}' - \vec{r}|^3} d^3\vec{r}' \quad (1)$$

In Equation (1), $\phi(r)$ represents a phase (rad) at a position r, $\gamma$ represents a magnetic rotation ratio of a proton, $B_0$ represents the intensity of the static magnetic field (T), $\tau_{TE}$ represents an echo time (TE) (sec), $\chi(r')$ represents a susceptibility (ppm) at a position r', and $\alpha$ represents an angle formed by a static magnetic field direction and a vector r'-r.

As represented by Equation (1), the phase distribution $\phi$ (phase image) is obtained by spatially convolution-integrating the susceptibility distribution $\chi$ (susceptibility map). Since all the pixels in the phase image are targets, Equation (1) may be represented as Equation (2) using a vector and a matrix.

$$\Phi = C_\chi \quad (2)$$

Here, $\Phi$ represents a column vector of a phase image in which the number of all the pixels is N, and $\chi$ represents a column vector of a susceptibility map to be calculated. Further, C represents a matrix having a size of N×N and corresponding to the convolution operation for the susceptibility distribution $\chi$.

From Equation (2), the susceptibility map is calculated using the least squares method. Here, an error function is introduced, and a solution is obtained by minimizing the error function. The error function is weighted according to the degree of phase variation at each place in the phase image $\phi$. Accordingly, the error function to be used is represented as the following Equation (3).

$$e(\chi) = \|W \cdot (\Phi - C_\chi)\|^2 \quad (3)$$

Here, W represents a column vector of a phase image in which the number of all the pixels is N, which is a weighting factor for giving a weight to the error of each pixel. As described above, the image in which the pixel value of each pixel is the weighting factor for giving the weight to the error function for the susceptibility calculation is referred to as a weighting image. Further, · represents multiplication of vector elements, and ∥*∥ represents the norm of *. The error function is not necessarily limited to the form of Equation (3). For example, the error function may be set in a form in which a regularization term is given.

In the present embodiment, the weighting image is calculated from the phase image. Accordingly, the image converter 500 of the present embodiment generates the phase image from the complex image generated by the image reconstructor 400, calculates the weighting image from the phase image, and calculates the susceptibility map from the phase image and the weighting image.

In order to realize this process, as shown in FIG. 3, the image converter 500 of the present embodiment is provided with a phase image generator (phase image generating means) 510 that generates the phase image from the complex image, a phase image processor (phase image processing means) 520 that performs phase image processing for the phase image, a weighting image calculator (weighting image calculation means) 530 that generates the weighting image from the phase image, and a susceptibility map calculator (susceptibility map calculation means) 540 that calculates the susceptibility map from the phase image and the weighting image.

<Flow of Image Conversion Process>

Figure 6:
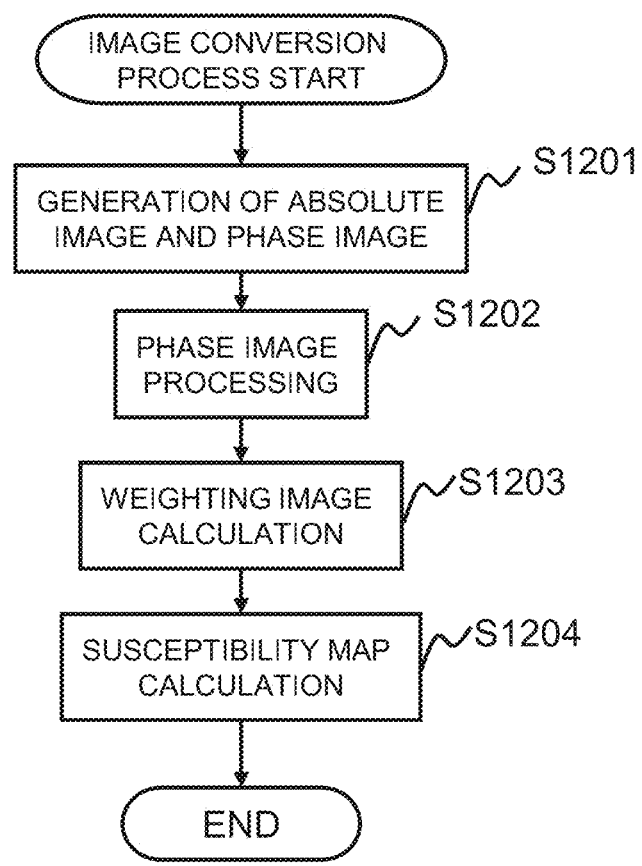
FIG. 6 is a flowchart illustrating an image conversion process according to an embodiment of the invention.

The flow of the image conversion process performed by the respective parts of the image converter 500 will be described. FIG. 6 shows a process flow of the image conversion process according to the present embodiment.

First, the phase image generator 510 generates the absolute image and the phase image from the complex image (step 1201). The absolute image and the phase image are respectively generated from an absolute component and a phase component of the complex number of each pixel of the complex image.

A pixel value S(j) of the absolute image and a pixel value φ(j) of the phase image in a pixel j are respectively calculated from the following Equation (4) and Equation (5) using a pixel value c(j) of the complex image.

$$S(j)=|c(j)| \qquad (4)$$

$$\phi(j)=\arg\{c(j)\} \qquad (5)$$

Then, the phase image processor 520 performs the phase image processing for the phase image φ calculated by the phase image generator 510 to calculate a phase image φ' after processing (step S1202). Here, the phase image processor 520 removes a phase component derived from a cause other than the susceptibility, and extracts a phase component derived from the susceptibility. Details of the phase image processing will be described later. Here, the phase image processing may not be performed.

Then, the weighting image calculator 530 performs a weighting image calculation process for the phase image φ' (or phase image φ) to calculate a weighting image W used for calculating the susceptibility map (step S1203). In the present embodiment, the weighting image calculator 530 calculates the phase variation of each pixel from the phase image φ' (or phase image φ), and calculates the weight based on the calculated phase variation. Details of the weighting image calculation process performed by the weighting image calculator 530 will be described later.

If the weighting image W is obtained, the susceptibility map calculator 540 calculates the susceptibility map to be displayed in the display device 210 from the calculated weighting image W and phase image φ' (or phase image φ) (step S1204).

<Phase Image Processing>

Figure 7:
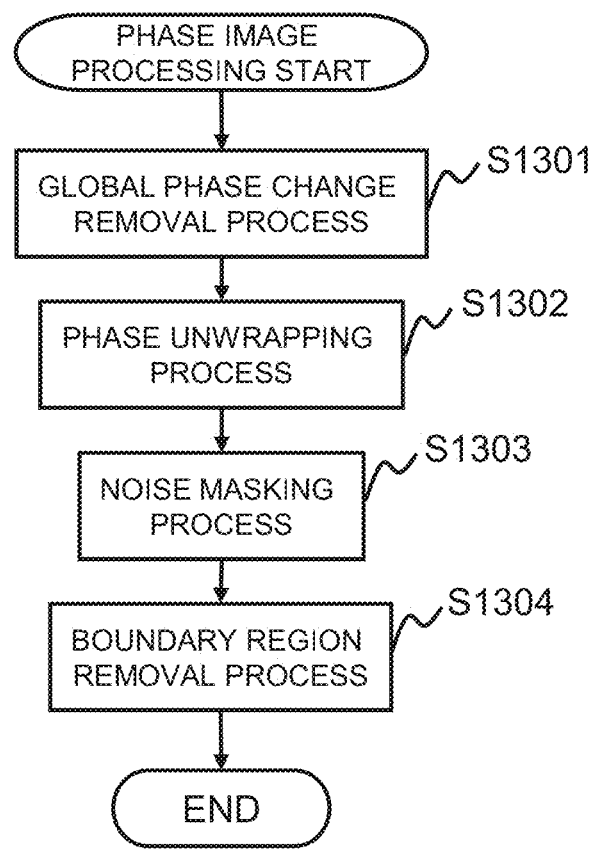
FIG. 7 is a flowchart illustrating phase image processing according to an embodiment of the invention.

Next, the phase image processing performed by the phase image processor 520 will be described. In the present embodiment, four types of the phase image processing are performed. The four types of the phase image processing will be described with reference to a process flow shown in FIG. 7.

First, the phase image processor 520 performs a global phase change removal process of removing a global phase change from the phase image (step S1301). Here, as the global phase change removal process, the phase image processor 520 performs a low pass filtering process at every two-dimensional image for the phase image (three-dimensional image; original image) calculated by the phase image generator 510 so as to calculate a low resolution image. Further, the phase image processor 520 complex-divides the original image by the low resolution image. Through the global phase change removal process, the phase image processor 520 removes the global phase change included in the low resolution image from the original image.

The phase image calculated by Equation (5) corresponds to the sum of a global phase change due to an unevenness of static magnetic field that occurs depending on the shape or the like of an imaging portion (for example, head portion or the like) and a local phase change due to a susceptibility change between tissues. The global phase change and the local phase change correspond to a low frequency component and a high frequency component of the original phase image in the k-space, respectively. In this process, since only the global phase change is removed, the local phase change due to the susceptibility change between the tissues can be calculated.

In order to remove the global phase change, various methods may be used. For example, there is a method of extracting a global phase change by fitting the phase image with a low-order polynomial and subtracting the extracted global phase change from the original image. In the global phase change removal process of the present embodiment, such a different method may be used.

Then, the phase image processor 520 performs a phase unwrapping process of correcting a wrap of the phase (step S1302).

In a certain region of the phase image, a phase value exceeding a range from −π to π shifts by 2nπ and is wrapped in the range from −π to π (n is an integer of 1 or more). Thus, in order to obtain an accurate phase in the entire region of the brain, it is necessary to correct the wrappings. In the present embodiment, for example, the phase value wrapped in the range from −π to π is corrected using a region growing method.

Then, the phase image processor 520 performs a noise masking process for a region including only a noise component (noise region) in the phase image (step S1303). The noise masking process is performed to set the phase value of the noise region (non-signal region, air region) to 0. In the present embodiment, as the noise masking process, the phase image processor 520 creates a mask image using the absolute image, and then, multiplies the phase image by the created mask image.

The mask image is created using a predetermined threshold value. That is, in the absolute image, the pixel value of a region having a value smaller than the threshold value is set to 0, and the pixel values of the other regions are set to 1. The threshold value may be calculated from the pixel value distribution of all the pixels of the absolute image using a discriminant analysis method or the like.

As the noise masking process, various methods may be used. For example, in order to create the mask image used in the noise masking process, a method of setting the pixel value of the air region to 0 may be used. In this case, the phase image processor 520 detects a boundary portion between the brain and air, and extracts the air region based on the detection result. In the noise masking process according to the present embodiment, another method as mentioned above may also be used.

Then, the phase image processor 520 performs a process (boundary region removal process) of removing the boundary region between the brain and the air from the phase image passed through the noise masking process (step S1304). The phase of the boundary region adjacent to the air shows a severe spatial change compared with the other regions, which may become a cause of the occurrence of an artifact in the calculated susceptibility map. Thus, it is necessary to remove the boundary region.

In the boundary region removal process according to the present embodiment, by enlarging the region from the air region in the phase image subjected to the noise masking process using the region growing method and changing the phase value to 0 when the phase value exceeds a predetermined threshold value, the phase image processor 520 removes the boundary.

As the boundary region removal process, various known methods may be used. For example, a method of fitting the phase change of the boundary region using the Gaussian function and subtracting the fitted phase change from the original image may be used. In the boundary region removal process according to the present embodiment, another method as mentioned above may be used.

The above-described four processes in the phase image processing are only examples, and the invention is not necessarily limited thereto. Further, any of the four processes may not be performed. For example, when the echo is obtained using a sequence having a short echo time, the wrap does not occur. In this case, the phase unwrapping process is not necessary. Further, the order of performing the respective processes is arbitrary. In addition, the phase image processing may not be performed. If the phase image processing is not performed, although the noise or the phase unevenness is not removed, the susceptibility map can be calculated with a small number of processes and a short process time.

<Weighting Image Calculation Process>

Next, the weighting image calculation process performed by the weighting image calculator 530 of the present embodiment will be described. As described above, in the present embodiment, the weighting image is calculated from the phase image. Here, the weighting image calculator 530 calculates the phase variation of each pixel from the phase image, and calculates the weight based on the degree of the calculated phase variation. In the present embodiment, the weighting image calculator 530 determines the weight so that as the phase variation becomes larger, the weight becomes smaller. That is, the weight is determined to monotonically decrease in a broad sense as the phase variation increases. Here, when two different phase variations x1 and x2 satisfy the relation of x1<x2, and when weights f(x1) and f(x2) calculated from the respective phase variations satisfy the relation of f(x1)≥f(x2), it is determined that the weight monotonically decreases in a broad sense as the phase variation increases.

The phase variation of each pixel is calculated using plural phases in regions around the pixel. Hereinafter, a region around a certain pixel used to calculate the phase variation of the certain pixel is referred to as a calculation region.

In order to realize the above-mentioned weighting image calculation process, the weighting image calculator 530 of the present embodiment is provided with a phase component complex image calculator (phase component complex image calculation means) 531 that calculates a phase component complex image from the phase image, a region setter (region setting means) 532 that sets the calculation region as a region where the weight is calculated, a phase variation image calculator (phase variation image calculation means) 533 that calculates a phase variation image using a phase variation as a pixel value from the phase image, and a weighting image converter (weighting image converting means) 534 that converts the phase variation image into a weighting image.

<Flow of Weighting Image Calculation Process and Details of Respective Processes>

Figure 8:
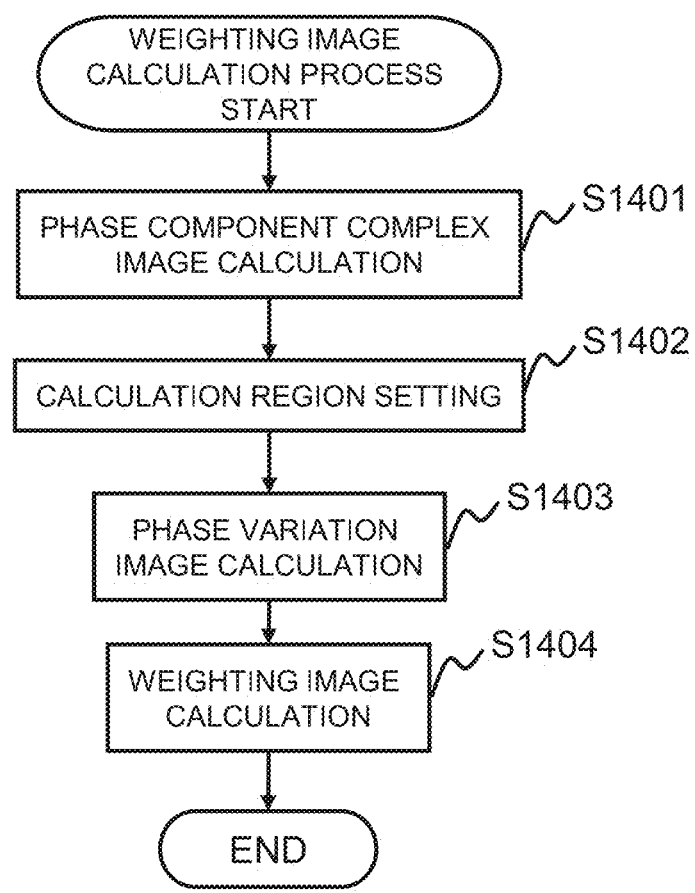
FIG. 8 is a flowchart illustrating a weighting image calculation process according to an embodiment of the invention.

The procedure of the weighting image calculation process of the present embodiment performed by the above-described respective parts will be described with reference to a process flow shown in FIG. 8.

The phase component complex image calculator 531 calculates a phase component complex image z from the phase image (step S1401). In the present embodiment, a phase component complex image z (j) of a pixel (j) is calculated by the following Equation (6) using the phase image $\phi'(j)$ processed in step S1202.

$$z(j)=\exp(i\cdot\phi'(j)) \quad (6)$$

Here, i is an imaginary number.

When n is set to a predetermined integer of 1 or more, the relation of $\exp(i\cdot(\phi+2n\pi))=\exp(i\cdot\phi)\cdot\exp(i\cdot 2n\pi)=\exp(i\cdot\phi)$ is obtained. Accordingly, by using the phase component complex image, it is possible to calculate the phase variation without the phase wrap influence. That is, by using the phase component complex image, it is possible to calculate a correct phase variation with respect to the phase image in which the phase unwrapping process is not performed or the phase in a region where the phase unwrapping process fails.

Step S1401 may not be performed. Further, when the phase image processing of step S1202 is not performed, in Equation (6), instead of the phase image $\phi'(j)$, the phase image $\phi(j)$ calculated in step S1201 is used. Further, even when the phase image processing of step S1202 is performed, the phase component complex image may be calculated using the phase image $\phi(j)$ instead of the phase image $\phi'(j)$. Further, the phase component complex image may be calculated using the phase image in which only a part of the process of step S1202 is performed, for example, using the phase image in which only the global phase change removal process is performed.

Then, the region setter 532 sets the calculation region (step S1402). In the present embodiment, the region setter 532 sets the calculation region as a p×p×p cube having p voxels in the frequency encoding direction of the phase image, p voxels in the phase encoding direction thereof, and p voxels in the slice direction thereof. Here, p is an arbitrary integer of 2 or more, which may be a predetermined value, or may be set by a user.

The size or shape of the calculation region is arbitrary. Generally, the larger the calculation region is, the wider a "small weight region" with respect to a "large phase variation region" becomes. Also, the wider the "small weight region" becomes, the larger the artifact reduction effect is. Accordingly, the larger the calculation region becomes, the more the artifact can be reduced. However, if the "small weight region" is excessively wide, the weight is reduced up to the region where the phase variation is small, and thus, the estimation accuracy of the susceptibility map to be calculated is reduced.

For example, when the "small weight region" is to be widened in a state where an initial value of the calculation region is a 3×3×3 cube, the calculation region may be set to a 5×5×5 cube according to an instruction of the user.

Further, the size of the calculation region may be set according to the resolution of an image. That is, the size of the calculation region is changed according to the resolution. For example, the larger the resolution in the slice direction becomes, the more the phase distribution for each slice varies, and the more the phase variation distribution between adjacent slices also varies. That is, if the slice interval is large, the correlation between slices is small. Thus, an arbitrary threshold value $t_s$ may be set, and then, in the case of an image having a resolution in the slice direction that is smaller than $t_s$ mm, the p×p×p (for example, p=3) cube may be used as the calculation region, and in the case of an image having a resolution in the slice direction that is equal to or larger than $t_s$ mm, a p×p (for example, p=3) square in the slice may be used as the calculation region.

Further, the calculation region may be set to have an arbitrary shape, instead of the cube or square. For example, voxels of which the distance from a certain voxel is within r mm may be used as the calculation region.

FIG. 9 shows a conceptual diagram of a calculation region 802 set on a phase image 801 in the present embodiment. It is assumed that the horizontal direction in FIG. 9 is the frequency encoding direction, the vertical direction is the phase encoding direction, and the direction perpendicular to the plane of the figure is the slice direction.

For example, when a 3×3 square of 3 voxels in the frequency encoding direction and 3 voxels in the phase encoding direction is used as the calculation region 802, as shown in FIG. 9, the calculation region 802 of a pixel j 803 becomes a region of 9 voxels surrounded by a thick frame.

Then, the phase variation image calculator 533 calculates a phase variation image v (step S1403). In the present embodiment, the pixel value v(j) of the phase variation image v of the pixel j is used as a value of a standard deviation of a phase component complex image $z(k_j)$ in the calculation region in the pixel j. That is, the pixel value v(j) is calculated by the following Equation (7).

$$v(j) = \sqrt{\frac{1}{s}\sum_{kj}(m(j) - z(k_j))^2} \qquad (7)$$

Here, $k_j$ represents a pixel in the calculation region in the pixel j. $k_j$ has a value from 1 to $p^3$. For example, when the calculation region is the 3×3×3 cube, $k_j$ has a value from 1 to 27. s represents the number of pixels ($p^3$) in the calculation region. In this example, s=27. m(j) is an average value of z in the calculation region of the pixel j. That is, $m(j)=\Sigma_{kj}(z(k_j))/s$. When the phase variation v(j) is defined by Equation (7), an upper limit of the phase variation v(j) becomes 1, and a lower limit thereof becomes 0, regardless of the image.

The phase variation image v may be calculated from an arbitrary image other than the phase component complex image z. For example, the phase image φ' after the phase image processing in step S1202 may be used. Further, the phase image φ before the phase image processing in step S1202 may be used. Further, the phase image which only a part of the process in step S1202 is performed, for example, the phase image which only the global phase change removal process is performed, may be used.

Further, a method for calculating the phase variation image v is arbitrary. For example, as indicated by the following Equation (8), the standard deviation may be calculated using a coefficient $g(k_j)$.

$$v(j) = \sqrt{\frac{1}{s}\sum_{kj}\{g(k_j)\cdot(m(j) - z(k_j))^2\}} \qquad (7)$$

A standard deviation with a large contribution of a voxel $k_j$ having a large coefficient $g(k_j)$ may be calculated by using Equation (8).

The coefficient $g(k_j)$ may be set to an arbitrary value. For example, the coefficient $g(k_j)$ may be set according to a distance from the pixel (voxel j) of which the phase variation is calculated. Specifically, the coefficient $g(k_j)$ may be defined as $g(k_j)=1/r(k_j)$ using the distance $r(k_j)$ between the voxel j and $k_j$. Here, the standard deviation in which the contribution of a voxel close to the voxel j is large and the contribution of a voxel distant from the voxel j is small is calculated. Thus, for example, when the resolutions in the respective directions of the image are different from each other, the phase variation that reflects the difference of the resolutions can be calculated.

Further, the pixel value v(j) of the phase variation image v of the pixel j may be used as a variance value of the phase component complex image $z(k_j)$ in the calculation region in the pixel j, instead of the standard deviation thereof. Further, the sum $(v(j)=\Sigma_{kj}|\phi(k_j)|)$ of absolute values of the pixel values in the calculation region of the phase image φ before processing or after processing in the pixel j or the difference $(v(j)=\max\{\phi(k_j)\}-\min_{kj}\{\phi(k_j)\})$ between the maximum value and the minimum value in the calculation region may be used as the pixel value v(j).

Finally, the weighting image converter 534 calculates the weighting image by converting the phase variation image v into the weighting image W (step S1404). In the present embodiment, the weight in the region where the phase variation is small is made large, and the weight in the region where the phase variation is large is made small. Thus, it is possible to calculate the weighting image based on the degree of the phase variation.

A weight W(j) of each pixel j in the present embodiment is set, for example, as a value obtained by subtracting the phase variation v(j) from a predetermined constant. Specifically, the weight W(j) is calculated by the following Equation (9).

$$W(j)=1-v(j) \qquad (9)$$

The relational equation of the weight W(j) and the phase variation v(j) is not limited to Equation (9). For example, the weight W(j) may be calculated by the following Equation (10) using the maximum value $v_{max}$ in all the pixels of the phase variation image v.

$$W(j)=(v_{max}-v(j))/v_{max} \qquad (10)$$

In the calculation method of the phase variation image v, the upper limit of the weight W(j) may be changed according to images. In this regard, by calculating the weight using Equation (10), the weight W(j) may be set to a value from 1 to 0 regardless of the images.

Further, the weight W(j) may be set as a value obtained by dividing a predetermined constant by the phase variation v(j). That is, the weight W(j) may be calculated by the following Equation (11).

$$W(j)=1/v(j) \qquad (11)$$

By calculating the weight W(j) using Equation (11), the change of the weight W(j) for the change of the phase variation v(j) becomes large, compared with a case where the weight W(j) is calculated using Equation (9) or Equation (10).

Further, the weight W(j) may be calculated using a predetermined threshold value t and based on the large/small relation between the phase variation v(j) and the threshold value t. That is, the weight W(j) of the pixel of which the phase variation v(j) is smaller than the predetermined threshold value t may be set to a predetermined constant, and the weight W(j) of the pixel of which the phase variation v(j) is equal to or larger than the threshold value t may be set to 0. For example, when the phase variation v(j) is smaller than the threshold value t, the weight W(j) is set to 1, and when the phase variation v(j) is equal to or larger than the threshold value t, the weight W(j) is set to 0. This is expressed as the following Equation (12).

$$W(j)=\begin{cases}1 & (v(j)<t)\\ 0 & (v(j)\geq t)\end{cases} \qquad (12)$$

By calculating the weight W(j) using Equation (12), the weight in the region where the phase variation v(j) is smaller than the threshold value t can be set to a constant value in calculation of the susceptibility map.

Further, the weight W may be calculated using a combination of an image other than the phase variation image v and the phase variation image v. For example, the weight W(j) may be calculated by the following Equation (13) using an absolute image S and the phase variation image v.

$$W(j)=\{1-v(j)\}\cdot S(j) \quad (13)$$

<Susceptibility Map Calculation Process>

Figure 10:
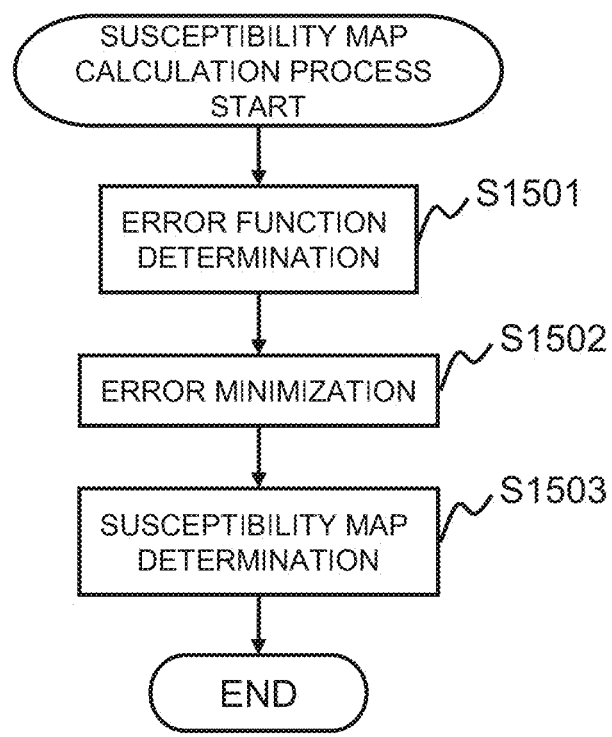
FIG. 10 is a flowchart illustrating a susceptibility map calculation process according to an embodiment of the invention.

Next, the susceptibility map calculation process performed by the susceptibility map calculator 540 of the present embodiment will be described. Here, the process will be described with reference to a process flow of the susceptibility map calculation process shown in FIG. 10.

First, the susceptibility map calculator 540 determines an error function indicating a difference between a calculated phase image and a susceptibility map candidate to be calculated (step S1501). Further, the susceptibility map calculator 540 determines a susceptibility map candidate that minimizes the error function (step S1502), and makes the determined susceptibility map candidate as the susceptibility map (step S1503).

The susceptibility map calculator 540 uses the relation of the phase distribution φ and the susceptibility distribution χ expressed by Equation (1) for determination of the error function. In the present embodiment, the susceptibility map calculator 540 uses the error function e(χ) shown in FIG. 3, and determines the susceptibility map candidate by minimizing the error function e(χ). The weighting image calculated in step S1203 is used for the weighting image W in Equation (3).

The error function is not limited to the form of Equation (3). For example, various known function forms such as a function form obtained by adding a regularization term such as an L1 norm or an L2 norm, a regularization term such as a more general Lp norm (p>0), or the like to Equation (3) may be used.

The error calculated based on the error function e(χ) is minimized by repetition calculation using the biconjugate gradient method, for example. There are various known methods such as a steepest descent method for minimizing the error function. For minimizing the error function, other method may be employed.

Further, there are various known methods for calculating the susceptibility map from the phase image and the weighting image. In the present embodiment, these methods may be used.

As described above, the MRI apparatus 101 of the present embodiment is provided with the scan controller 300 that measures the magnetic resonance signal generated from the subject according to the irradiation of the radio frequency magnetic field pulse as the complex signal; the image reconstructor 400 that reconstructs the complex image in which each pixel value is the complex number from the complex signal; the image converter 500 that converts the complex image into the susceptibility map; and the display processor 600 that displays the converted susceptibility map in the display device. The image converter 500 is provided with the phase image generator 510 that generates the phase image from the complex image; the weighting image calculator 530 that calculates the weighting image from the phase image; and the susceptibility map calculator 540 that calculates the susceptibility map from the phase image and the weighting image.

As described above, in the present embodiment, when the susceptibility map is estimated from the phase image, the weighting image given to the error function to be used is obtained from the phase image. The phase image has a small change of the pixel value due to a cause other than the phase variation, such as a T1 value or T2 value in the tissues, compared with the absolute image. Accordingly, it can be said that the phase image reflects the phase variation with high accuracy. In the present embodiment, since the weight is calculated using the above-described phase image, the weighting image in which the phase variation is reflected with high accuracy can be obtained. Further, since the susceptibility map is calculated using the weighting image, the estimation accuracy of the susceptibility map is improved, and the artifact is also reduced.

For example, for a patient with Alzheimer's disease that is a type of neurodegenerative disorder, it is known that the amount of iron deposition of plural tissues within a brain such as a putamen tissue increases according to the progress of the disease, and as a result, the susceptibility increases. According to the present embodiment, the susceptibility of these tissues can be measured with high accuracy. Accordingly, obtainment of objective information relating to the rate of progress of the Alzheimer's disease is expected.

<Comparison Result with Prior Art>

FIG. 11A to FIG. 11F are schematic diagrams illustrating an absolute image 911, a phase image 921, a weighting image 912 in the prior art, and a susceptibility map 913 calculated from the weighting image 912, a weighting image 922 and a susceptibility map 923 calculated in the present embodiment, in a region where the SN ratio is reduced due to a large susceptibility change. An arrow 900 represents the direction of a static magnetic field.

In the weighting image 912 in the prior art, the weight is calculated in proportion to the pixel value of the absolute image 911. As shown in the figures, a region 924 where the phase varies is larger than a region 914 where the pixel value of the absolute image 911 is lowered due to the influence of the static magnetic field. Thus, in the weighting image 912 calculated from the absolute image 911, the weight becomes small only in a region 915 where the pixel value of the absolute image 911 is lowered.

On the other hand, in the weighting image 922 calculated in the present embodiment, the weight of the entire region corresponding to the region 924 where the phase variation is large in the phase image 921 becomes small. Further, according to the size of the calculation region when the weight is calculated, a region 925 where the weight is small becomes wider than a region 924 where the phase variation is large. As a result, in the susceptibility map 923 calculated in the present embodiment, a streaking artifact 916 is reduced, compared with the susceptibility map 913 calculated using the weighting image 912 based on the absolute image 911.

FIG. 12A to FIG. 12D show an absolute image 931, a phase image 941, a weighting image 942 and a susceptibility map 943 calculated in the present embodiment in a region where the SN ratio is reduced due to a large susceptibility change in a human head image.

As shown in the figures, a region 944 where the phase varies is larger than a region 934 where the pixel value of the absolute image 931 is lowered due to the influence of the static magnetic field. In the weighting image 942 calculated in the present embodiment, the weight of the entire region of the region 944 where the phase variation is large becomes small. Further, according to the size of the calculation region when the weight is calculated, a region 945 where the weight is small becomes wider than a region 944 where the phase variation is large. As a result, by using the weighting image 942 calculated in the present embodiment, the susceptibility map 943 can be calculated without occurrence of the streaking artifact.

<Modification Examples>

In the present embodiment, the case using the horizontal magnetic field MRI apparatus 101 is described as an example, but even when the vertical magnetic field MRI apparatus 100 or other devices are used, the same processes may be applied to obtain the same effects. Further, even when the imaging section is an arbitrary imaging section such as a cross section, a coronal section, a sagittal section, or an oblique section, the same processes may be applied to obtain the same effects.

Further, the measurement may be performed plural times while variously changing the angle of the imaging portion (for example, head portion) with respect to the fixed static magnetic field direction, and one susceptibility map may be calculated from the obtained plural complex images. The various change of the angle of the imaging portion (for example, head portion) with respect to the fixed static magnetic field direction corresponds to a various change of the direction of the applied static magnetic field with respect to the susceptibility distribution of the imaging tissue (for example, brain tissue). Accordingly, due to this measurement, it is possible to obtain plural phase images when the static magnetic field is applied in different directions.

By calculating the susceptibility map from the plural phase images, it is possible to enhance the accuracy of a solution compared with a case where the solution is calculated from one phase image.

Further, the susceptibility map calculation process may be directly performed from the complex image without conversion of the complex image into the absolute image and the phase image.

Further, an image having a different contrast from that of the susceptibility map may be created by performing image processing for the susceptibility map, and may be displayed in the display device 210. For example, an emphasis mask in which a susceptibility difference between tissues is emphasized may be created from the susceptibility map, and a susceptibility difference emphasis image obtained by multiplying the created emphasis mask by the absolute image may be displayed.

In the susceptibility difference emphasis image, although information of the susceptibility of the tissue is lost by the process of emphasizing the susceptibility difference, the contrast between a tissue having a high susceptibility and tissues other than the high susceptibility tissue increases. Thus, the tissue having the high susceptibility is clearly depicted.

The weighting image calculated in the present embodiment may be used in the global phase change removal in the phase image processing. In a method of the global phase change removal, the global phase change is extracted by fitting the phase image using a low-order polynomial, and is then subtracted from the original image. Here, by using the weighting image calculated in the present embodiment in the error function in the fitting, the fitting can be performed in which the contribution of the region where the phase variation is small becomes large.

Further, the phase variation image calculated in the present embodiment may be used in the noise mask calculation in the phase image processing. By using a predetermined threshold value, and by setting a pixel value in a region of the phase variation image of which the pixel value is smaller than the threshold value to 0 and setting a pixel value in the other region to 1, it is possible to calculate a noise mask in which the region where the phase variation is small is extracted.

Further, the phase variation image calculated in the present embodiment may be used in the phase wrap removal process in the phase image processing. In a method of the phase wrap removing process, the phase value wrapped in the range from $-\pi$ to $\pi$ is corrected using the region growing method. In the region growing method, when the correction of the phase value fails in a certain region, the failure is enlarged to a neighboring region. Further, in the region where the phase variation is large, there is a high possibility that the correction of the phase value fails, compared with the region where the phase variation is small. Thus, by enlarging the region from the region where the pixel value of the phase variation image calculated in the present embodiment is small, it is possible to perform the phase correction from a region where the possibility of the process failure is low.

Further, in the above-described embodiments, an example in which the functions of the respective parts of the image reconstructor 400, the image converter 500, and the display processor 600 are realized within the computer 209 provided in the MRI apparatus 101 is shown, but the invention is not limited thereto. For example, at least one of the respective parts may be provided in an information processor (image processor) independent from the MRI apparatus 101 and capable of transmitting and receiving data to and from the computer 209 of the MRI apparatus 101.

What is claimed is:

1. A magnetic resonance imaging apparatus, comprising:
a scan controller configured to measure a magnetic resonance signal generated from a subject according to irradiation of a radio frequency magnetic field pulse as a complex signal;
an image reconstructor configured to reconstruct a complex image in which a pixel value is a complex number from the complex signal;
an image converter configured to convert the complex image into a susceptibility map; and
a display processor configured to display the susceptibility map in a display device,
wherein the image converter comprises:
a phase image generator configured to generate a phase image from a phase component of a complex number of each pixel of the complex image,
a weighting image calculator configured to:
calculate a phase variation of each pixel from the phase image, and
calculate a weighting image based on the degree of the calculated phase variation, and
a susceptibility map calculator configured to:
determine an error function indicating a difference between the phase image and a susceptibility map candidate to be calculated, and
determine the susceptibility map that minimizes the error function.

2. The magnetic resonance imaging apparatus according to claim 1,
wherein the weighting image calculator comprises:
a phase variation image calculator configured to calculate a phase variation image in which a degree of the phase variation is a pixel value from the phase image; and
a weighting image converter configured to convert the phase variation image into the weighting image.

3. The magnetic resonance imaging apparatus according to claim 2,
wherein the weighting image calculator further comprises a region setter configured to set a region used for the calculation of the phase variation as a calculation region.

4. The magnetic resonance imaging apparatus according to claim 3,
wherein the region setter changes the size of the calculation region according to a resolution.

5. The magnetic resonance imaging apparatus according to claim 4,
wherein the region setter sets a cubic region as the calculation region when the resolution in a slice direction is smaller than a predetermined threshold value, and sets a square region in a slice plane as the calculation region when the resolution in the slice direction is equal to or larger than the predetermined threshold value.

6. The magnetic resonance imaging apparatus according to claim 3,
wherein the phase variation image calculator calculates a standard deviation or a variance of pixel values of the phase image in the calculation region as the phase variation.

7. The magnetic resonance imaging apparatus according to claim 3,
wherein the phase variation image calculator calculates a standard deviation or a variance of pixel values of the phase image in the calculation region with a predetermined coefficient as the phase variation.

8. The magnetic resonance imaging apparatus according to claim 7,
wherein the coefficient is set according to a distance from a pixel where the phase variation is calculated.

9. The magnetic resonance imaging apparatus according to claim 2,
wherein the weighting image converter determines each pixel value of the weighting image to monotonically decrease in a broad sense as the phase variation increases.

10. The magnetic resonance imaging apparatus according to claim 9,
wherein the weighting image converter sets a value obtained by subtracting the phase variation from a predetermined constant value as the pixel value.

11. The magnetic resonance imaging apparatus according to claim 9,
wherein the weighting image converter sets a value obtained by dividing a predetermined constant value by the phase variation as the pixel value.

12. The magnetic resonance imaging apparatus according to claim 9,
wherein the weighting image converter sets the pixel value of a pixel of which the phase variation is smaller than a predetermined threshold value to a predetermined constant, and sets the pixel value of a pixel of which the phase variation is equal to or larger than the predetermined threshold value to 0.

13. The magnetic resonance imaging apparatus according to claim 1,
wherein the weighting image calculator further comprises a phase component complex image calculator configured to
calculate a phase component complex image from the phase image by: $z(j)=\exp(i \cdot \phi'(j))$ wherein $z(j)$ is the phase component complex image of a pixel (j), and
calculates the weighting image from the phase component complex image calculated from the phase image.

14. An image processing apparatus, comprising:
an image converter configured to convert a complex image into a susceptibility map; and
a display processor configured to display the susceptibility map in a display device,
wherein the image converter comprises:
a phase image generator configured to generate a phase image from a phase component of a complex number of each pixel of the complex image,
a weighting image calculator configured to:
calculate a phase variation of each pixel from the phase image, and
calculate a weighting image based on the decree of the calculated phase variation, and
a susceptibility map calculator configured to:
determine an error function indicating a difference between the phase image and a susceptibility map candidate to be calculated, and
determine the susceptibility map that minimizes the error function, and
wherein the complex image is an image reconstructed from a magnetic resonance signal generated from a subject according to irradiation of a radio frequency magnetic field pulse.

15. A susceptibility map calculation method, comprising:
generating, by phase image generator, a phase image from a phase component of a complex number if each pixel of a complex image obtained by collecting and reconstructing a magnetic resonance image generated from a subject according to irradiation of a radio frequency magnetic field;
calculating, by a weighting image calculator, a phase variation of each pixel from the phase image, and calculating a weighting image based on the degree of the calculated phase variation; and
determining, by a susceptibility map calculator, and error function indicating a difference between the phase image and a susceptibility image candidate to be calculated, and determining a susceptibility image that minimizes the error function.

* * * * *